United States Patent
Chang

(10) Patent No.: US 6,555,468 B2
(45) Date of Patent: Apr. 29, 2003

(54) METHOD FOR FORMING TRENCH INCLUDING A FIRST AND A SECOND LAYER OF PHOTORESIST

(75) Inventor: Ching-Yu Chang, I Lan Hsien (TW)

(73) Assignee: Macronix International Co., Ltd. (TW)

( * ) Notice: Subject to any disclaimer, the term of this patent is extended or adjusted under 35 U.S.C. 154(b) by 59 days.

(21) Appl. No.: 09/799,004

(22) Filed: Mar. 6, 2001

(65) Prior Publication Data

US 2002/0090812 A1 Jul. 11, 2002

(30) Foreign Application Priority Data

Jan. 9, 2001 (TW) ........................................ 90100463 A

(51) Int. Cl.⁷ ..................... H01L 21/4763; H01L 21/44
(52) U.S. Cl. ..................... 438/634; 438/638; 438/672
(58) Field of Search ..................... 438/637, 638, 438/672

(56) References Cited

U.S. PATENT DOCUMENTS 6,063,711 A * 5/2000 Chao et al. ..................... 216/74
6,180,516 B1 * 1/2001 Hsu ..................... 438/638
6,287,960 B1 * 9/2001 Lao ..................... 438/637

* cited by examiner

Primary Examiner—Olik Chaudhuri
Assistant Examiner—William M. Brewster

(57) ABSTRACT

A method of fabricating trench is disclosed. A first inter-metal dielectrics (IMD) layer, a mask layer and a second IMD layer are formed sequentially on a semiconductor substrate. Afterwards, a first phototresist layer is formed on the second IMD layer. Thereafter, a photolithography and etching process are performed to transfer a photo mask pattern to form a first opening inside the IMD layer wherein the mask layer serves as an etching stop layer. Subsequently, a second phototresist layer is formed on the second IMD layer and inside the first opening sidewall. A portion of the second phototresist layer on the first IMD layer is removed, and simultaneously the mask layer and the first IMD layer is etched to form a second opening until the semiconductor substrate is exposed. Eventually, the first phototresist layer and the second phototresist layer are stripped simultaneously so as to form a trench having the first opening and the second opening.

19 Claims, 4 Drawing Sheets

METHOD FOR FORMING TRENCH INCLUDING A FIRST AND A SECOND LAYER OF PHOTORESIST

FIELD OF THE INVENTION

The present invention generally relates to a method for manufacturing semiconductor devices, and more particularly, to a method for forming trench in semiconductor devices.

BACKGROUND OF THE INVENTION

With the fast developments of semiconductor manufacturing process techniques, the dimensions of integrated circuits (ICs) are rapidly scaled down into sub-micron level. Oxide isolation of IC is increasingly important, particularly isolation of active areas of IC devices during the period of semiconductor processes. In general, a local oxidation (LOCOS) process is employed to form these oxide isolation regions, but the LOCOS process may induce a bird's beak structure such that the active areas of devices are unacceptably encroached.

Therefore, a trench process is widely used by semiconductor manufacturers to form isolation structure between active areas. Unfortunately, the conventional process of manufacture for trench is too complicated to control the stability of the process. Furthermore, the deviation of alignment mark is easily induced when the photo mask is being aligned in the process period. The conventional manufacturing processes of trench are shown in FIG. 1 to FIG. 6.

Referring to FIG. 1, a first silicon oxide ($SiO_2$) layer 12, a silicon nitride ($Si_3N_4$) 14 and a second silicon oxide layer 16 are sequentially deposited on a semiconductor substrate 10.

Referring to FIG. 2, a first photoresist layer 20 is spun on the second silicon oxide layer 16, and then a photolithography process and dry etching is employed to form a recess 22 on the second silicon oxide layer 16 wherein the silicon nitride layer 14 is used as an etching stop layer.

Referring to FIG. 3, the first photoresist layer 20 is removed to form a first opening 30.

Referring to FIG. 4, the second photoresist layer 40 is coated on the second silicon oxide layer 16 and the first opening 30.

Referring to FIG. 5, a second opening 50 is formed on the silicon nitride layer 14 and the first silicon oxide layer 12 by using a photolithography and dry etching process until the semiconductor substrate 10 is exposed.

Finally, referring to FIG. 6, the trench 60, composing of the first 30 and the second opening 50, is formed as the second photoresist layer 40 is removed.

According to the mentioned-above, the conventional process of trench 60 makes use of two coated-photoresist steps to form the first and the second patterns with respect to the first 30 and the second 50 opening respectively. Afterwards, two photolithography and dry etching steps are implemented to form the trench 60 including the first 30 and the second opening 50. As a result, the conventional process of the trench 60 is carried out with additional phototresist removal, using two steps of stripping photoresist layer (20, 40), which increased the difficulty of the process and the manufacturing process cost.

Furthermore, when using photo mask alignment, an alignment mark deviation between the first opening 30 and the second opening 50 is usually induced, causing a asymmetric trench 60 structure, such that the filling of trench 60 is decreased seriously, which may substantially downgrade the isolation effect of ICs.

SUMMARY OF THE INVENTION

In view of the problems encountered with the foregoing conventional trench isolation.

As a result, the primary object of the present invention is to provide a new method of forming trench to decrease manufacturing steps and cost.

Another object of the present invention is forming a symmetric trench structure to increase the filling ability of the trench and easily control the consequent processes.

According to the above objects, the present invention discloses a method of fabricating trench. A first inter-metal dielectrics (IMD) layer, a mask layer and a second IMD layer are formed sequentially on a semiconductor substrate. Afterwards, a first phototresist layer is formed on the second IMD layer. A photolithography and etching process are performed to transfer a photo mask pattern to form a first opening inside the IMD layer wherein the mask layer serves as an etching stop layer. Thereafter, a second phototresist layer is formed on the second IMD layer and inside the first opening sidewall. A portion of the second phototresist layer on the first IMD layer is removed, and simultaneously the mask layer and the first IMD layer is etched to form a second opening until the semiconductor substrate is exposed. Finally, the first phototresist layer and the second phototresist layer are stripped simultaneously so as to form a trench having the first opening and the second opening.

In summary, the present invention offers a method of fabricating the trench having a lot of benefits such as a decreasing manufacturing steps, a conformal surface of the phototresist layer and a symmetric trench structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a new method of forming a trench. As shown in FIGS. 7–12, these figures illustrate cross-sectional views of the processes for forming a trench in accordance with the present invention.

Figure 1:
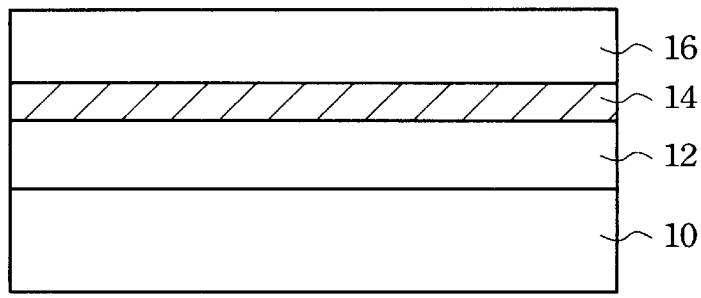
FIGS. 1–6 illustrate cross-sectional views of the conventional processes for fabricating trench.
Figure 2:
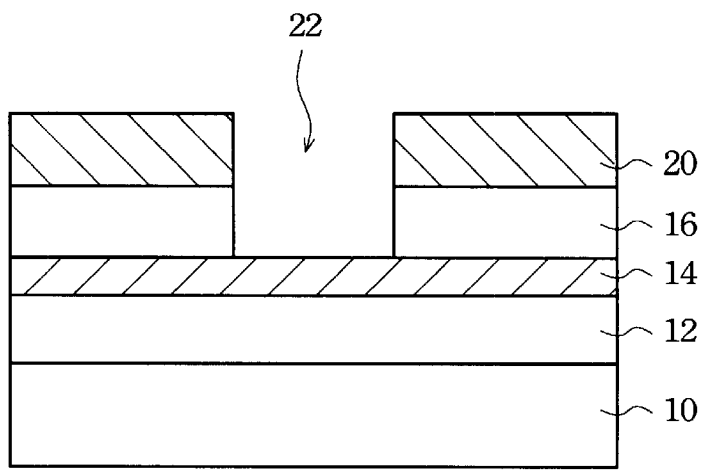
Figure 3:
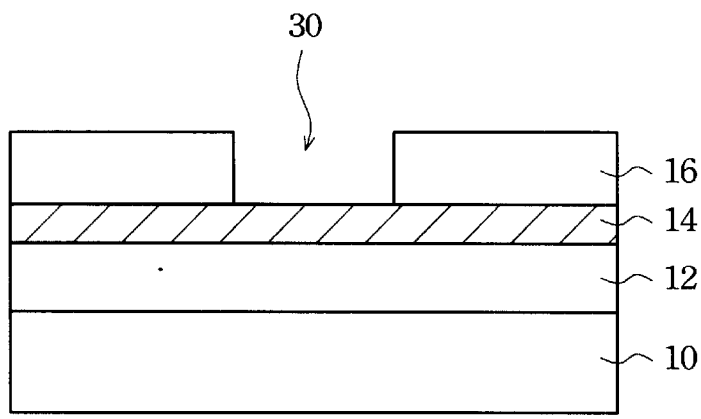
Figure 4:
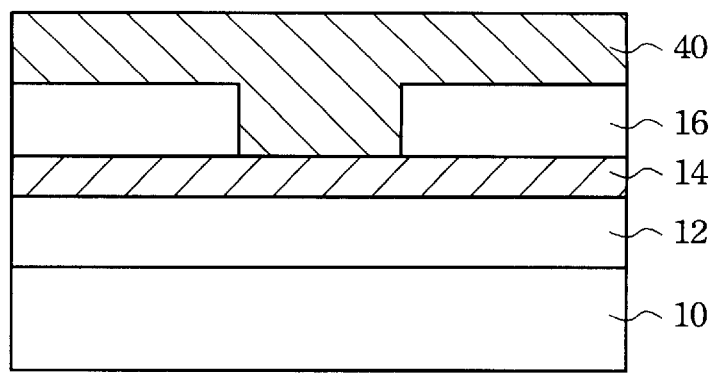
Figure 5:
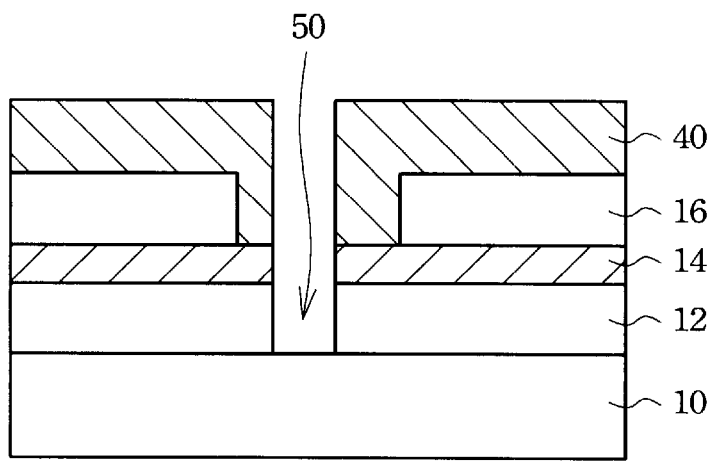
Figure 6:
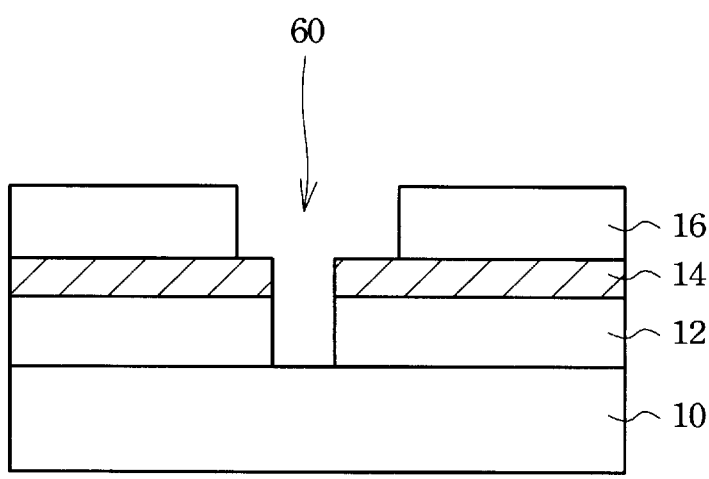
Figure 7:
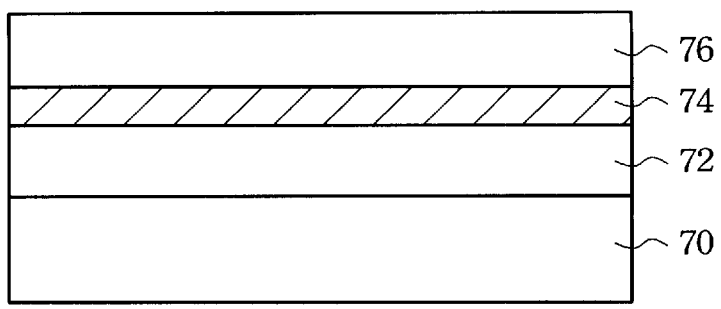
FIGS. 7–12 illustrate cross-sectional views of the processes for fabricating trench according to a preferred embodiment of the present invention.

Referring FIG. 7, a first inter-metal dielectrics (IMD) layer 72, a mask layer 74 and a second IMD layer 76 are sequentially deposited on the semiconductor substrate 70. In the preferred embodiment of the present invention, the process of forming the first IMD layer 72 may be a chemical vapor deposition. The first IMD layer 72 material, having a thickness range between about 2500 angstroms to 3500 angstroms, is the one selected from one group consisting of silicon oxide ($SiO_x$), borophosphosilicate glass (BPSG) and fluorinesilicate glass (FSG).

Further, the process of forming the mask layer 74 may be a chemical vapor deposition wherein the mask layer 74 material is either silicon nitride ($Si_3N_4$) or silicon oxynitride ($SiO_xN_y$) having a thickness range between about 100 angstroms to 500 angstroms. Furthermore, the process of forming the second IMD layer 76 may be a chemical vapor deposition. The second IMD layer 76 material, having a thickness range between about 2500 angstroms to 3500 angstroms, is the one selected from one group consisting of silicon oxide ($SiO_x$), borophosphosilicate glass (BPSG) and fluorinesilicate glass (FSG).

Figure 8:
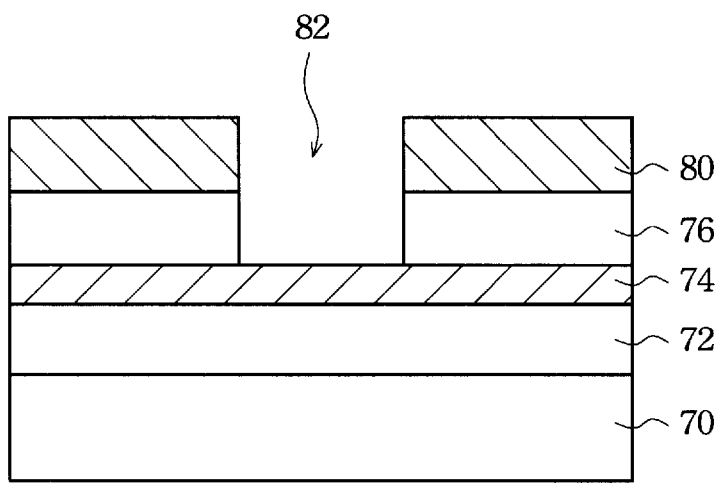

Referring to FIG. 8, a first photoresist layer 80 is formed on the second IMD layer 76 and then a photo mask pattern is transferred onto the second IMD layer 76 by using a photolithography process. Next, the second IMD layer 76 is etched to form a first opening 82 inside the second IMD layer 76 in accordance with the photo mask pattern by using the mask layer 74 as an etching stop layer. For example, either hydrofluoric acid (HF) or buffer-oxide etch (BOE) serves as an etchant of the silicon oxide ($SiO_x$).

Figure 9:
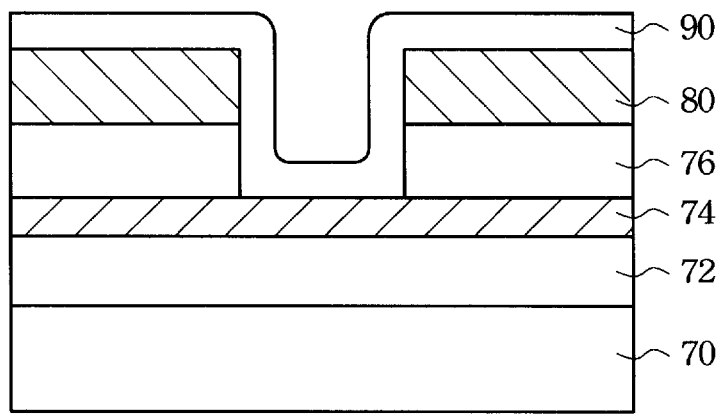

Referring to FIG. 9, a second photoresist layer 90 is formed, such as spun-on or the like, on the first photoresist layer 80 and the first opening 82 sidewall.

Figure 10:
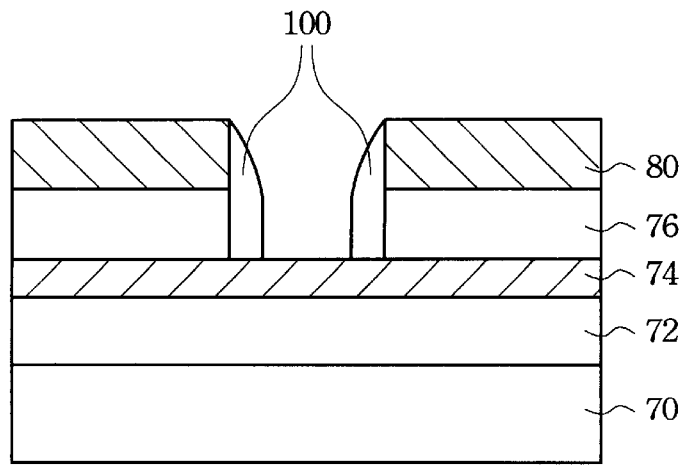

Referring to FIG. 10, a portion of the second photoresist layer 90 on the first IMD layer 70 is removed to form a photoresist spacer 100 on the first opening 82 sidewall and the mask layer 74 is exposed. For example, oxygen ($O_2$) gas is used as an etchant to remove the portion of the second photoresist layer 90.

Figure 11:
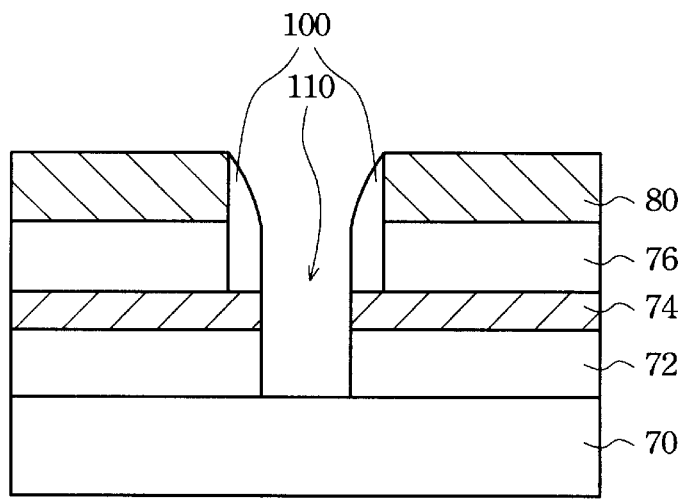

Referring to FIG. 11, the mask layer 74 and the first IMD layer 74 are simultaneously etched away to form the second opening 110 until the semiconductor substrate 70 is exposed. In the preferred embodiment of the present invention, the mixed gas of $C_4F_8$, $CF_4$, $CHF_3$, $N_2$ and CO are used to etch either the silicon nitride ($Si_3N_4$) layer or silicon oxynitride ($SiO_xN_y$) layer. Moreover, either hydrofluoric acid (HF) or buffer-oxide etch (BOE) serves as an etchant of the silicon oxide ($SiO_x$).

Figure 12:
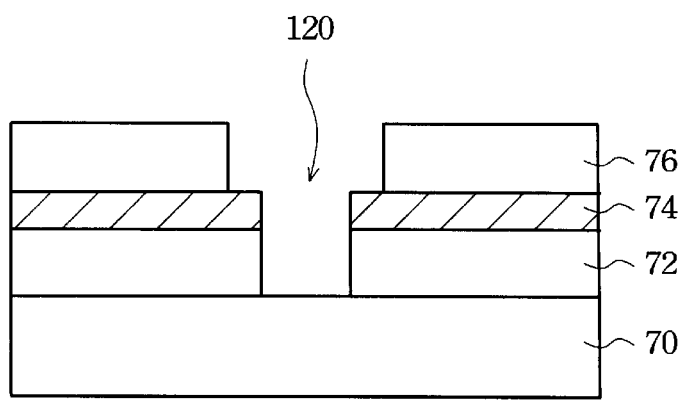

Finally, referring to FIG. 12, the first photoresist layer 80 and the photoresist spacer 100 inside the first opening 82 sidewall are removed respectively so that a trench 120 is fabricated on the semiconductor substrate 70. The trench 120 comprises the first 82 and second 110 opening wherein the size of the first opening 82 is lager than that of the second opening 110. In the preferred embodiment of the present invention, the first photoresist layer 80 and the photoresist spacer 100 within the first opening 82 sidewall are ashed away by oxygen ($O_2$) gas.

Many advantages of the present invention are described as follows: (1) The manufacturing process of a trench 120 is decreased effectively. Only a photoresist stripped process is used to remove the first photoresist layer 80 and the photoresist spacer 100 inside the first opening 82 at the same time, which is better than that of the prior art. (2) The surface of the second photoresist layer 90 is conformal. The surface of the second photoresist layer 90 inside the first opening 82 sidewall has a conformal topography to make it easy to control the thickness of the second photoresist layer 90 for the consequent processes. (3) An excellent symmetric trench 120 is constructed. Due to the preferred conformal phototresist spacer, the preferred symmetric trench 120 topography is constructed so that the filling ability of the trench 120 is extremely improved.

Consequently, the present invention offers a method of fabricating the trench 120 having a lot of benefits such as a decreasing manufacturing steps, a conformal surface of the photoresist layer and a symmetric trench 120 structure.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming a trench, comprising:
   forming sequentially a first inter-metal dielectrics (IMD) layer, a mask layer and a second IMD layer on a semiconductor substrate;
   forming a first photoresist layer on said second IMD layer;
   performing a photolithography and etching process to transfer a photo mask pattern to form a first opening inside said second IMD layer, wherein said mask layer serves as an etching stop layer;
   forming a second photoresist layer on said first photoresist layer and inside said first opening;
   removing a portion of said second photoresist layer to expose a portion of said mask layer within the first opening, and etching said exposed mask layer and said first IMD layer thereunder to form a second opening until said semiconductor substrate is exposed; and
   stripping said first photoresist layer and said second photoresist layer to form a trench having said first opening and said second opening.

2. The method of claim 1, wherein said step of forming said first (IMD) layer comprises a chemical vapor deposition (CVD) process.

3. The method of claim 2, wherein said first IMD material is the one selected from one group consisting of silicon oxide ($SiO_x$), borophosphosilicate glass (BPSG) and fluorinesilicate glass (FSG).

4. The method of claim 3, wherein said step of forming said mask layer comprises a chemical vapor deposition (CVD) process.

5. The method of claim 4, wherein said mask material is the one of either silicon nitride ($Si_3N_4$) or silicon oxynitride ($SiO_xN_y$).

6. The method of claim 1, wherein said step of forming said second IMD layer comprises a chemical vapor deposition (CVD) process.

7. The method of claim 6, wherein said second IMD material is the one selected from one group consisting of silicon oxide ($SiO_x$), borophosphosilicate glass (BPSG) and fluorinesilicate glass (FSG).

8. The method of claim 1, wherein said step of removing a portion of said second photoresist layer on said first IMD layer mask layer further comprises forming a photoresist spacer inside said first opening sidewall.

9. The method of claim 8, wherein said photoresist spacer is used as a protection layer when forming said second opening.

10. The method of claim 1, wherein the size of said first opening is larger than said size of said second opening.

11. A method for forming a symmetric trench, comprising:
   providing a semiconductor substrate;
   forming a first inter-metal dielectric (IMD) layer on said semiconductor substrate;
   forming a mask layer on said first IMD layer;
   forming a second IMD layer on said mask layer;
   performing a photolithography process to transfer a photo mask pattern onto said second IMD layer;
   etching said second IMD layer according to the photo mask pattern to form a first opening inside said second IMD layer wherein said mask layer is used as an etching stop layer;

forming a second photoresist layer on said first photoresist layer and inside said first opening sidewall;

removing a portion of said second photoresist layer to expose a portion of said mask layer within the first opening;

etching said mask exposed layer and said first IMD layer thereunder to form a second opening until said semiconductor substrate is exposed; and stripping simultaneously said first photoresist layer and said second photoresist layer to form a symmetric trench having said first opening and said second opening wherein a size of said first opening is larger than said size of said second opening.

12. The method of claim 11, wherein said step of forming said first (IMD) layer comprises a chemical vapor deposition (CVD) process.

13. The method of claim 12, wherein said first IMD material is the one selected from one group consisting of silicon oxide ($SiO_x$), borophosphosilicate glass (BPSG) and fluorinesilicate glass (FSG).

14. The method of claim 11, wherein said step of forming said mask layer comprises a chemical vapor deposition (CVD) process.

15. The method of claim 14, wherein said mask material is the one of either silicon nitride ($Si_3N_4$) or silicon oxynitride ($SiO_xN_y$).

16. The method of claim 11, wherein said step of forming said second IMD layer comprises a chemical vapor deposition (CVD) process.

17. The method of claim 16, wherein said second IMD material is the one selected from one group consisting of silicon oxide ($SiO_x$), borophosphosilicate glass (BPSG) and fluorinesilicate glass (FSG).

18. The method of claim 11, wherein said step of removing a portion of said second photoresist layer on said first IMD layer mask layer further comprises forming a photoresist spacer inside said first opening sidewall.

19. The method of claim 18, wherein said photoresist spacer is used as a protection layer when forming said second opening.

* * * * *